United States Patent [19]

Huang

[11] Patent Number: 4,843,440
[45] Date of Patent: Jun. 27, 1989

[54] MICROWAVE FIELD EFFECT TRANSISTOR

[75] Inventor: Ho-Chung Huang, Germantown, Md.

[73] Assignee: United States of America as represented by the Administrator of the National Aeronautics & Space Administration, Washington, D.C.

[21] Appl. No.: 675,471

[22] Filed: Nov. 29, 1984

Related U.S. Application Data

[63] Continuation of Ser. No. 327,659, Dec. 4, 1981, abandoned.

[51] Int. Cl.$^4$ ............................................. H01L 29/80
[52] U.S. Cl. ...................................... 357/22; 357/68; 357/76; 357/81; 357/55
[58] Field of Search ..................... 357/16, 228, 76, 685

[56] References Cited

U.S. PATENT DOCUMENTS

| | | | |
|---|---|---|---|
| 4,135,168 | 1/1979 | Wade | 357/22 |
| 4,183,041 | 1/1980 | Goel | 357/22 |
| 4,380,022 | 4/1983 | Yoder | 357/22 |

FOREIGN PATENT DOCUMENTS

| | | | |
|---|---|---|---|
| 55-21184 | 2/1980 | Japan | 357/22 |
| 55-91134 | 7/1980 | Japan | 357/68 |
| 55-151370 | 11/1980 | Japan | 357/22 |

OTHER PUBLICATIONS

K. Honjo et al., "Bruad-Band Int. Match of Micro Power GaAs Fetz" IEEE Trans. on Micro. Tha Tech., vol. MTT-23 #1, Jan. 1979, pp. 3-8.
M. Fukuta et al., "GaAs Microwave Power Fet," IEEE Trans. on Elec. Oev., vol. Ed-23 #4, Apr. 1976, pp. 388-394.
R. Camisa et al., "A Mounting Structure for GaAs FET's Providing Increased Gain," RCA Tech. Notes, #1176, 3-17-77, 2 pages.

Primary Examiner—Joseph E. Clawson, Jr.
Attorney, Agent, or Firm—R. Dennis Marchant; John R. Manning; Ronald F. Sandler

[57] ABSTRACT

Electrodes of a high power, microwave field effect transistor are substantially matched to external input and output networks. The field effect transistor includes a metal ground plane layer, a dielectric layer on the ground plane layer, a gallium arsenide active region on the dielectric layer, and substantially coplanar spaced source, gate and drain electrodes having active segments covering the active region. The active segment of the gate electrode is located between edges of the active segments of the source and drain electrodes. The gate and drain electrodes include inactive pads remote from the active segments thereof. The pads are connected directly to the input and output networks. The source electrode is connected to the ground plane layer. The space between the electrodes and the geometry of the electrodes establish parasitic shunt capacitances and series inductances that provide substantial matches between the input network and the gate electrode and between the output network and the drain electrode. Many of the devices are connected in parallel and share a common active region, so that each pair of adjacent devices shares the same source electrodes and each pair of adjacent devices shares the same drain electrodes. The gate electrodes for the parallel devices are formed by a continuous stripe that extends between adjacent devices and is connected at different points to the common gate pad.

11 Claims, 5 Drawing Sheets

MICROWAVE FIELD EFFECT TRANSISTOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

This application is a continuation, of application Ser. No. 327,659, filed 12/4/81 now abandoned.

TECHNICAL FIELD

The present invention relates generally to transistors, and more particularly to high power, microwave field effect transistors.

BACKGROUND ART

It is highly desirable in numerous communications applications to achieve output power of the order of two to ten watts in the microwave frequency range of 12 to 20 gigaHertz (GHz) from a gallium arsenide (GaAs) field effect transistor (FET). It is believed that these performance requirements are beyond the present state of the art. One of the reasons why such high power has not been attained in the stated frequency range is the low impedance of GaAs FETs, in particular the relatively low shunt impedance of the GaAs active region.

The input and output impedances of GaAs FETs are to be contrasted with the standard 50 ohm output and input impedances of the signal sources and loads which drive and are driven by the GaAs FETs. the impedance of the GaAs FET and the characteristic impedances of the input and output networks connected to the FET cause substantial mismatches. The mismatches are overcome by impedance matching networks that are connected between the input and output networks and a gate (input) electrode of the FET and one of a drain or source (output) electrode of the FET. The matching networks insert substantial losses and reduce the output power of the device. Impedance matching networks also frequently have dimensions such that terminals thereof are more than one wavelength away from an active region of the GaAs FET. Such a situation causes a substantial portion of the available microwave power from the source or amplified by the GaAs FET to be dissipated in a resistive component of the impedance matching networks. Because of these factors, the microwave output power and power gain of the GaAs FET are considerably reduced from the theoretical capability of the GaAs FET.

It is, however, necessary for an impedance match to exist between the GaAs FET and the source and load to which it is connected. Otherwise, a standing wave pattern is developed that causes a substantial loss in microwave power. There are also substantial losses in microwave power because of the finite resistance in transmission lines connecting the GaAs FET device to the source and load. For microwave, high power GaAs FET's, the losses in input and output impedance matching networks connected between the microwave source and load and the active device can be so high as to render the apparent performance of the GaAs FET considerably lower than the intrinsic performance of the GaAs FET.

THE INVENTION

It is, accordingly, an object of the present invention to provide a new and improved high power, microwave FET.

Another object of the invention is to provide a new and improved, high power, microwave GaAs FET that is matched to sources and loads having standard impedance.

A further object of the invention is to provide a new and improved high power, microwave GaAs FET that is designed so that the need for matching networks between the FET and a microwave source and microwave load is substantially obviated.

A further object of the invention is to provide a new and improved microwave, high power GaAs FET that is designed so that it is substantially matched to a source and load, whereby the need for power dissipating impedance matching networks is substantially obviated.

Still another object of the invention is to provide a new and improved high power, microwave FET that is connected directly to a source and a load, each having standard impedances, by way of internal matching networks having dimensions less than one wavelength.

In accordance with the present invention, a new and improved, high power, microwave GaAs FET minimizes losses in impedance matching networks and inactive zones (electrode segments that are not superimposed on an active region of the transistor where transistor action takes place) of the FET by limiting the total active area of each unit cell of the FET and by matching or partially matching the impedances of each unit cell to the source and load if a plurality of unit cells are combined in a single device having the usual external source, drain and gate electrodes.

To minimize losses in the inactive zones of each device, matching networks are physically located on the semiconductor chip immediately adjacent the GaAs active region of the high power, microwave GaAs FET and are actually part of the FET electrodes. By placing the matching networks within the device and immediately adjacent the active region, the area and therefore losses of the inactive zone are minimized.

In particular, the device includes a metal ground plane layer, a semi-insulating GaAs dielectric layer in a predetermined position with respect to the ground plane layer, and a gallium arsenide active region on the semi-insulating GaAs dielectric layer. Substantially co-planar spaced source, gate and drain electrodes have active segments covering and connected to the active region so that the active segment of the gate electrode is located between the active segments of the source and drain electrodes. Each of the electrodes includes an inactive segment that does not overlay the active region. The impedance of the GaAs active region is substantially less than the characteristic impedance of input and output networks that are respectively connected to the gate electrode and one of the source or drain electrodes. The inactive segment of the gate electrode includes a pad remote from the portion thereof located between the edges of the source and drain electrodes. The gate pad maybe adapted to be connected directly to the signal source or may, alternatively, be connected to an input network, preferably without the use of a wire lead which is likely to result in resistive losses as well as mismatching due to the inductance thereof. The inactive segment of one of the other electrodes, i.e., either the source or drain electrode (the drain electrode in the preferred embodiment), includes a pad remote from the gate electrode. The pad of the other electrode is adapted to be connected directly to the output network to supply a signal to the output network or alternatively, maybe connected to the load. The remaining electrode is grounded to the ground plane layer.

The spacing between the electrodes and the geometry of the electrodes establish parasitic shunt capacitances and series inductances that provide substantial matches between the source and the active region and between the load and the active region. The lengths of the inactive segments of the gate and other electrode are less than a wavelength of the microwave frequency of the signal supplied to the GaAs microwave field effect transistor. In a preferred embodiment, the lengths of these segments are approximately one-eighth of a wavelength, i.e., in the range of 40 degrees to 50 degrees, of the frequency of the signal being amplified. By providing a substantial impedance match and by minimizing the lengths of the inactive segments of the metal electrodes to less than one wavelength, high power gain and low losses are achieved.

To assist in achieving the desired output power, N active field effect devices are formed on the active layer, where N is an integer greater than one. Each of the active field effect devices includes co-planar spaced source, drain and gate electrodes that cover a single active region. Each pair of adjacent devices shares the same source electrodes, and each pair of adjacent devices share the same drain electrodes. The arrangement is such that: the gate electrode of device K is between the drain and source electrodes of device K, the drain electrodes of devices K and (K-1) are shared, and the source electrodes of devices K and (K+1) are shared, where K equals 2...(N-1). A common gate pad for the N gate electrodes are provided. A common pad is provided for one of the source or drain electrodes of each of the N devices; in the preferred configuration, the common pad is for the drain electrodes. The remaining electrodes of the N devices are connected to the ground plane; in the preferred embodiment, the remaining electrodes are the source electrodes. The gate electrodes of the N devices are formed as a continuous stripe that extends between adjacent ones of the devices and is connected at different points to the common gate pad for the N gate electrodes.

According to a further feature, the GaAs FET is arranged in a flip-chip configuration. In the flipchip configuration, gate, drain and source electrodes metalized on a gallium arsenide pellet have posts plated thereon. The gate and one of the drain or source posts are respectively bonded to input and output metalized strips plated onto a pair of dielectric layers that cover a copper substrate. A portion of the copper substrate extends between the dielectric layers and is bonded to the remaining posts, in the preferred embodiment the source post. In the preferred embodiment, the posts are gold and the portion of the substrate that extends between the dielectric strips is a gold plating on a copper island of the substrate.

The above and still further objects, features and advantages of the present invention will become apparent upon consideration of the following detailed description of several specific embodiments thereof, especially when taken in conjunction with the accompanying drawings.

Figure 1:
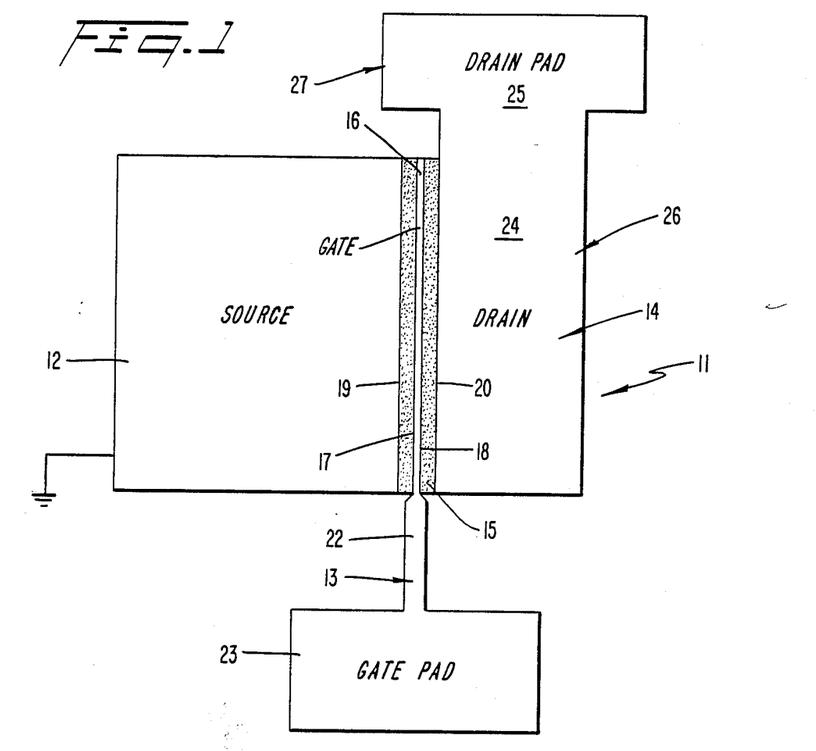
FIG. 1 is a schematic, topographical view of a single cell of a high power, microwave GaAs FET in accordance with one aspect of the invention.

BEST MODE FOR CARRYING OUT THE INVENTION:

Reference is now made to FIG. 1 of the drawing wherein there is illustrated a GaAs FET 11 including grounded, source electrode 12, gate electrode 13, and drain electrode 14. Electrodes 12, 13 and 14 are thin film, co-planar metalized areas that are deposited by any suitable method on gallium arsenide FET 11. The portions of electrodes 12, 13 and 14 which cover FET 11 active region 15 where transistor action takes place are referred to as the active segments of the electrodes, while the remaining portions of the electrodes are referred to as inactive segments of the electrodes.

Source electrode 12 is formed as a square or rectangle that is connected by a suitable post (not shown) in FIG. 1) to a metal substrate (not shown in FIG. 1) below active region 15. The edge of source electrode 12 facing a stripe portion of gate electrode 16 is coextensive with the active region 15. Gate electrode 13 includes the elongated stripe portion 16 having parallel edges 17 and 18 that are also parallel to edges 19 and 20 of electrodes 12 and 14, respectively. Edges 17 and 18 of portion 16 are spaced from edges 19 and 20; portion 16 has a length equal to or slightly greater than the length of edge 19 of electrode 12. Electrode 13 includes stub 22 that is longitudinally aligned with portion 16. Electrode 13 also includes a relatively large area gate pad 23 that is connected to the end of stub 22 remote from elongated portion 16. A network for supplying a microwave signal to be amplified is ohmically connected to gate pad 23, as described infra in the preferred embodiment; typically, the microwave signal has a frequency in the J, K or Ku band and may have a center frequency anywhere from approximately 12 to 16 GHz. The only active segment, coextensive with active region 15 of electrode 13, is elongated portion 16. Stub 22 and pad 23 of electrode 13 are spaced from a metal substrate for FET 11 by a dielectric layer (not shown in FIG. 1).

Drain electrode 14 is shaped as a T having elongated leg 24 and arm portion 25 that forms an inactive drain pad. Leg 24 is divided into active and inactive segments 26 and 27, such that the length of active segment 26 is equal to the length of edge 19 of source electrode 12 and of portion 16 of gate electrode 13. Inactive segment 27 connects active segment 26 to pad 25. All of active segment 26 of electrode 14 is coextensive with GaAs active region 15. Inactive segment 27 and drain pad 25 are deposited on a semi-insulating GaAs dielectric layer . Drain pad 25 is ohmically connected to either an output network or load which derive a power amplified replica of the microwave signal supplied to gate pad 23.

Figure 2:
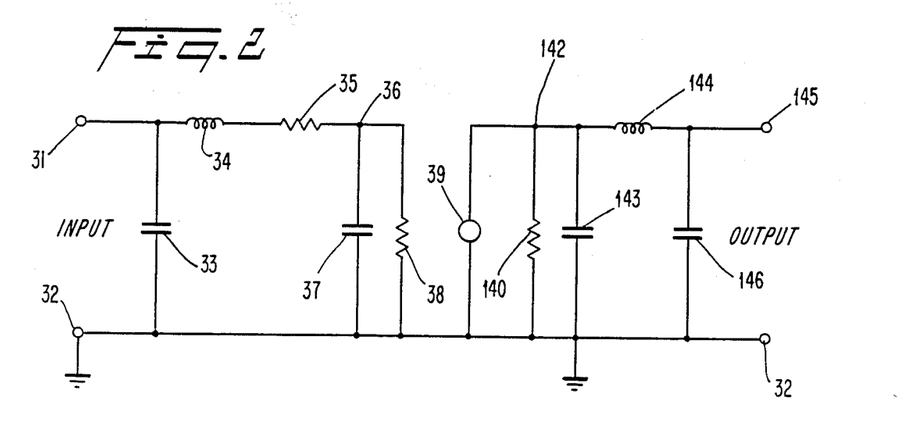
FIG. 2 is a circuit diagram of the GaAs FET illustrated in FIG. 1.

An electrical analysis of the structure of FIG. 1 is made by reference to the schematic diagram of FIG. 2. The microwave signal applied to gate pad 23 is illustrated in FIG. 2 as being applied between signal input terminal 31 and ground terminal 32. The capacitance ($C_{gp}$) of gate pad 23 to the grounded, metal substrate is represented by capacitor 33, connected between terminals 31 and 32. Metalized stub 22, between gate pad 23 and portion 16 of electrode 13, has a substantial inductance ($L_{gm}$) and a resistance $R_g$, respectively represented by inductance 34 and resistor 35 that are series connected between input terminal 31 and terminal 36. A capacitance ($C_{gs}$) subsists between parallel edges 17 and 19 of electrodes 13 and 12, respectively, and is represented in FIG. 2 by capacitor 37, between terminals 36 and 32. The portion of active region 15 between elongated portion 16 of electrode 13 and a grounded metal substrate to which the active region is connected has a resistive impedance that is represented in FIG. 2 by resistor 38, between terminals 36 and 32.

The output circuit of the device of FIG. 1 can be represented by current generator 39, shunted by resistor 140, between grounded terminal 32 and terminal 142. Resistor 140 is shunted by a capacitance ($C_{ds}$) represented by capacitor 143; capacitance $C_{ds}$ is established between parallel edges 18 and 20 of portions 16 and 26 of electrodes 13 and 14, respectively. Drain electrode 14 has a substantial inductance ($L_{dm}$) that is represented by a series inductor 144, between terminals 142 and 145, FIG. 2. There is also a substantial capacitance ($C_{dp}$) between drain electrode 14 and the grounded metal substrate, as represented by capacitor 146, between terminals 145 and 32.

In a typical high power device, N units of the type described in connection with FIGS. 1 and 2 are provided, where N is an integer greater than 1; in a preferred embodiment N is an integer greater than 1; in a preferred embodiment N is equal to 18. The RF voltage applied by gate pad 23 across active region 15 between edges 17 and 19 of each of the N cells modulates each of the active GaAs channels to control the current derived from each of the cells, as represented by current generator 39. Thereby, amplification of the signal applied to gate pad 23 is provided.

The input admittance of a single one of the cells or channels illustrated in FIG. 1, excluding the gate pad capacitance $C_{gp}$, can be expressed as:

$$Y_1 = \frac{1}{R_g + j\omega L_{gm} + \left(\frac{1}{R_c} + j\omega C_{gs}\right)^{-1}}$$

where: $R_g$, $L_{gm}$, $C_{gs}$ are defined supra, $R_c$ = the resistance of the channel, as represented by resistor 38, and $\omega$ = angular frequency of the microwave signal applied to pad 23.

For a composite FET with N channels, of the type illustrated in FIG. 1, connected in parallel so that each of the N channels shares a single gate pad, the input admittance is:

$$Y_{in} = j\omega C_{gp} + NY_1$$

As described in detail infra, it is possible to provide a single gate pad in such a configuration by providing a single stripe for each gate portion 16 of the N channels that form a composite cell.

In the present invention, the size of gate pad 23, and hence the value of capacitance $C_{gp}$ (capacitor 33) is designed as a part of a matching network for the microwave source connected to terminal 31. This is in contrast with the typical prior art wherein the gate pad capacitance $C_{gp}$ (capacitor 33) is generally fixed because of the fixed, relatively small area of the gate bonding pad; in the typical prior art configuration, the gate bonding pad has an area of approximately 3×3 mils. In the present invention, the gate inactive segment geometry, i.e., area and topographical configuration of gate pad 23 and stub 22, and the spacing between edges 17 and 19 are designed such that the gate source capacitance (capacitor 37), gate pad capacitance (capacitor 33) and gate pad inductance (inductor 34) obviate or reduce the need for an external matching network to be connected to the input network containing the microwave source which is, in turn, connected to terminal 31. The spacing between edges 18 and 20, as well as the geometry of drain electrode 14, is such that inductor 144 as well as capacitors 143 and 146 obviate or reduce the need for an external matching network between terminals 145 and 32 and the load.

Thus, the present invention provides a departure from the prior art situation wherein there is usually some inductance and resistance, introduced by bond wire and a package in series with the input and output admittances of the GaAs FET. In the prior art, therefore, a substantial portion of the microwave voltage is dissipated across the series inductance and resistance of the bonding wire and the package. This voltage drop across the parasitic impedance established by the bonding wire and package is especially severe for high frequency (about 16 GHz) and high power (above 2 watts) GaAs FET's.

As described in detail infra, N of the channels illustrated in FIG. 1 are connected to a single gate pad 23 and to a single drain pad 25 in such a way that there is no need for any bond wire and so that the length of the inactive segments is minimized. By connecting portion 16 of the several channels in series with each other, by a single continuous stripe, matching is achieved to the N low power FET channels before power combination. This approach has three major advantages:

(a) losses due to parasitic impedance are virtually eliminated because there are virtually no unwanted parasitic impedances;

(b) the band width of the GaAs FET is greatly improved because impedance matching exists at the terminal of the active channel, such that there is only a relatively short electric length (less than one wavelength) of the inactive segments between the active region and the input and output networks connected to the pads; and (c) loss in the matching networks formed by the electrodes is minimized because the individual low power unit cells, which have relatively high impedances, are matched, prior to being connected together.

Figure 3:
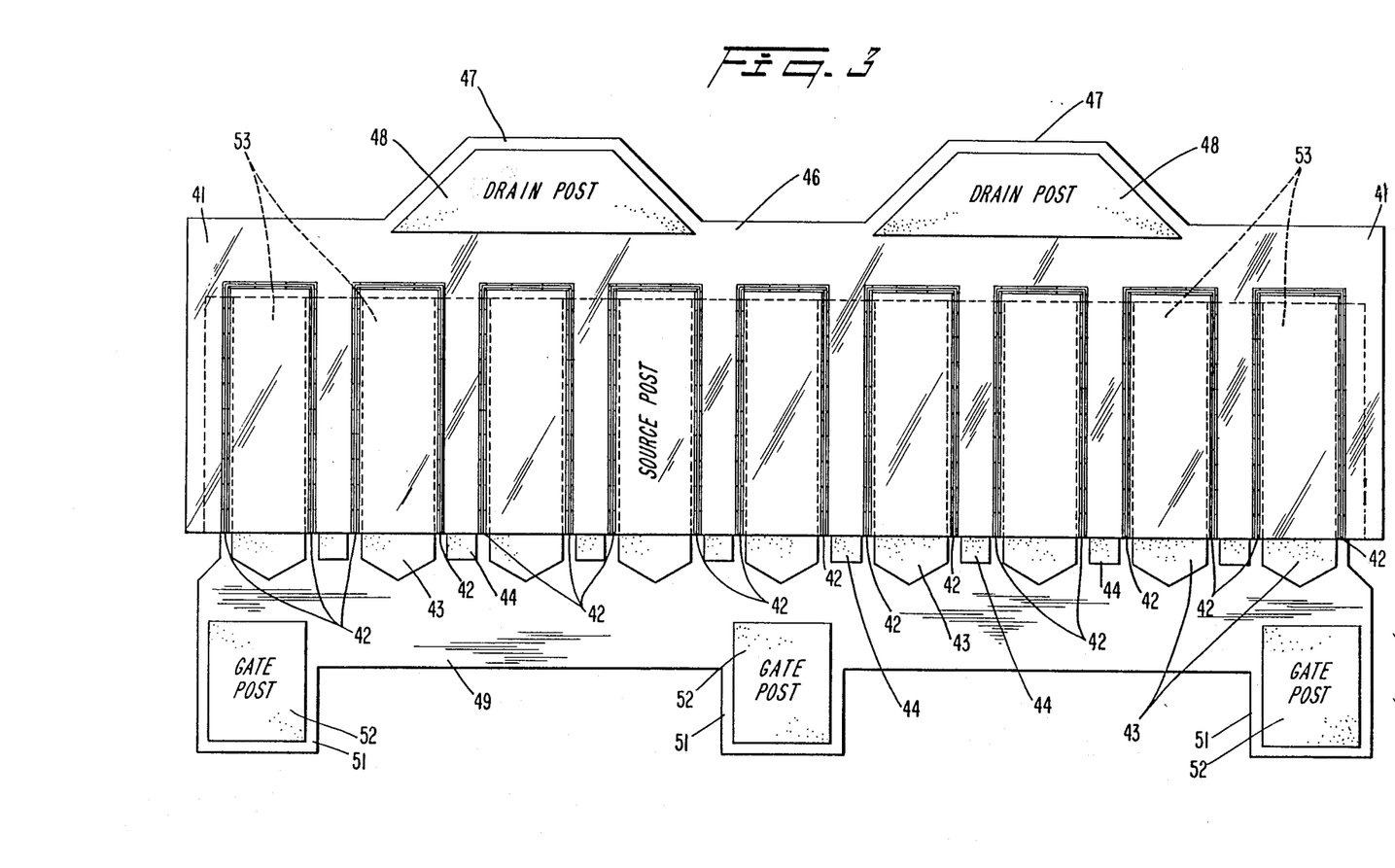
FIG. 3 is a top view of a GaAs FET employing a plurality of single FET units as illustrated in FIG. 1.

Reference is now made to FIG. 3 of the drawing, a top view of an 18 cell GaAs FET mounted on an internally matched carrier. The specific structure illustrated in FIG. 3 is designed to derive a 3.5 watt output signal in the microwave J band. Dimensions for the electrodes for such an output are indicated infra. To achieve the 3.5 watt output, three of the devices illustrated in FIG. 3 are combined in side by side relationship, similar to that described infra in connection with FIG. 4.

The structure of FIG. 3 includes an active gallium arsenide rectangular slab 41 that is superimposed on eighteen different field effect channels to define the active regions of eighteen parallel field effect devices. The eighteen different channels 42 are illustrated in FIG. 3 as spaced regions between the active segments of the source and drain electrodes. The same electrodes of the 18 devices are formed as nine metal fingers 43 that are interdigitated with ten metal fingers 44 that form the drain electrodes for the 18 devices; channels 42 are located between and spaced from the interdigitated fingers. In actuality each of channels 42 is configured in the same manner as the channel of FIG. 1, i.e., each of channels 42 includes an elongated portion, similar to elongated portion 16 of gate electrode 13. The elongated portion in each of channels 42 includes a pair of parallel edges spaced from parallel edges of fingers 43 and 44 which are adjacent to it. Thus, each of the 18 FET cells illustrated in FIG. 3 is arranged so that it shares a portion of its source with a first adjacent cell. Each of the 18 FET cells also shares a portion of its drain with a second adjacent cell. Thus, if N (where N is an integer greater than 1) cells are provided, the drains of cells K and K−1 are shared and the sources of cells K and K+1 are shared. The drain electrode is thus formed as N+2/2 elongated fingers 44 that are interdigitated with N/2 elongated fingers 43 that form the source electrode.

Interdigitated drain fingers 44 are integral with and have a common connection to elongated metal strip 46 that extends completely along the length of the composite 18 cell FET. Strip 46 includes two spaced trapezoidal tabs 47 equispaced from the ends of the composite FET and from the center of the composite FET. Plated on tabs 47 are metal drain posts 48, each having a trapezoidal shape, and preferably formed of a highly electrically conductive, inert material, such as gold. Drain posts 48 connect tabs 47 to the load via a conductive output network connected directly to the posts.

Figure 3A:
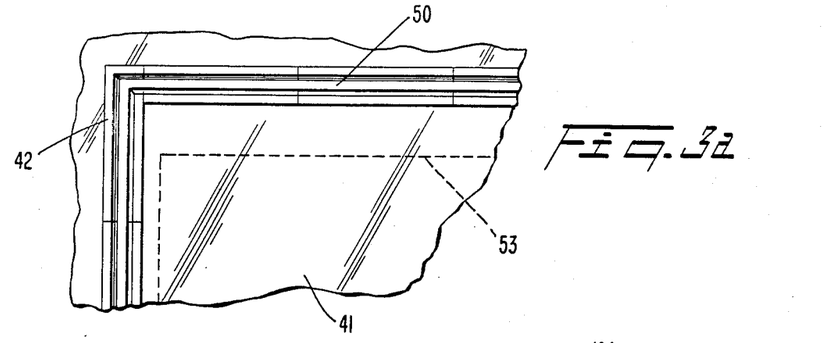
FIG. 3a is an enlarged view of a portion of the structure illustrated in FIG. 3.

Extending along the side of the composite FET opposite from strip 46 is an elongated metalized gate strip 49 that is an integral part of the continuous gate strips that extends between fingers 43 and 44; thus the gate stripe is connected to stripe 49 at the root of each fingers 43. The metalized gate pad includes three rectangular tabs 51, two of which are at opposite ends of the strip; the remaining rectangular tab is in the center of the strip. Extending from each of tabs 51 is a highly conductive, chemically inert metal post 52, preferably formed of gold. Posts 52 are connected to the input network which supplies the signal to be amplifier to the composite FET. An integral part of the gate electrode includes a continuous stripe, such as gate portion 16 (FIG. 1) that extends throughout the length of stripe 42. The metal strip that extends in stripe 42 and which is a part of the gate pad thereby has a continuous current pad parallel to and not contacting the lengths of the interdigitated source and drain fingers 43 and 44, as well as between and not contacting the interdigitated fingers, parallel to the roots or tips thereof. Thus, there is a continuous metal gate portion 50, FIG. 3a, completely surrounding each of source fingers 43. The metal portion of the gate, of course, is spaced from the fingers of the source pad to provide the necessary capacitive coupling between the source and gate pads.

In an actually constructed device, as illustrated in FIG. 3, the structure on which the electrode structure is mounted is 707 micrometers in length and 400 micrometers in width. Each of the interdigitated fingers 43 and 44 has a length of 150 micrometers. There is a spacing of 50 micrometers across each finger 43, between opposite, parallel edges of strips 42, and a distance of 23 micrometers between opposite, remote edges of stripe 42 across interdigitated fingers 44. With such dimensions, the distance between the inactive segments connected to gate posts 52 and the active segments above slab 41 is 40 degrees at a wavelength of 14 GHz, to establish a characteristic impedance of 16 ohms. The distance between the network connected to drain post 48 and the interdigitated fingers 44 is 50 degrees at 14 GHz, to establish a characteristic impedance of 20 ohms. While 16 and 20 ohm impedances do not provide exact matching between 50 ohm sources and loads to the GaAs FET, the mismatch is considerably less than the match which typically exists in the prior art, wherein the input and output impedances of the GaAs FET are on the order of two to three ohms.

The power gain of the device illustrated in FIG. 3 and the stated dimensional parameters extended from 8.6 dB at a frequency of 16 GHz to a gain of 12.3 dB, at a frequency of 12.5 GHz.

The interdigitated fingers 43 are connected to a grounded, highly conductive, metal substrate, preferably copper, by gold posts 53. One of posts 53 is provided for each of the interdigitated fingers 43. Post 53 is preferably deposited by thin film or other techniques on the substrate and bonded to the pads by utilizing known techniques.

Figure 4:
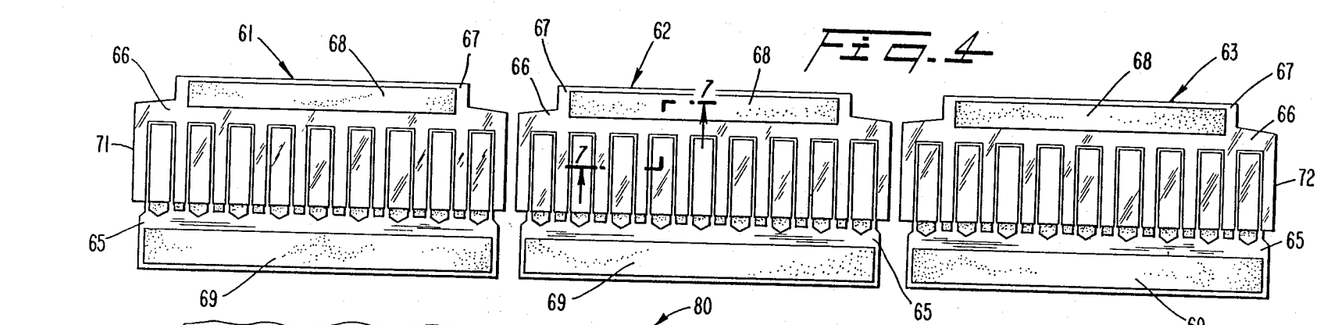
FIG. 4 is a top view of a 3-cell GaAs FET, wherein each cell includes 18 FET units of the type illustrated in FIG. 1.

Reference is now made to FIG. 4 of the drawing wherein three composite units 61, 62 and 63, each similar to the unit illustrated in FIG. 3, are illustrated in side by side relationship. The device of FIG. 4 is constructed for a 3.5 watt output in the Ku-band. Each of units 61, 62 and 63 includes 18 GaAs FET channels, interconnected together in a manner similar to the composite unit illustrated in FIG. 3. Each of units 61–63, however, differs from the unit illustrated in FIG. 3 because the units in FIG. 4 do not include drain and gate tabs 47 and 51. In all other respects, including dimensions and geometry of the interdigitated fingers and the continuous metallic stripe of the gate electrode for each of cells 61–63, the cells of FIGS. 3 and 4 are the same.

Figure 4A:
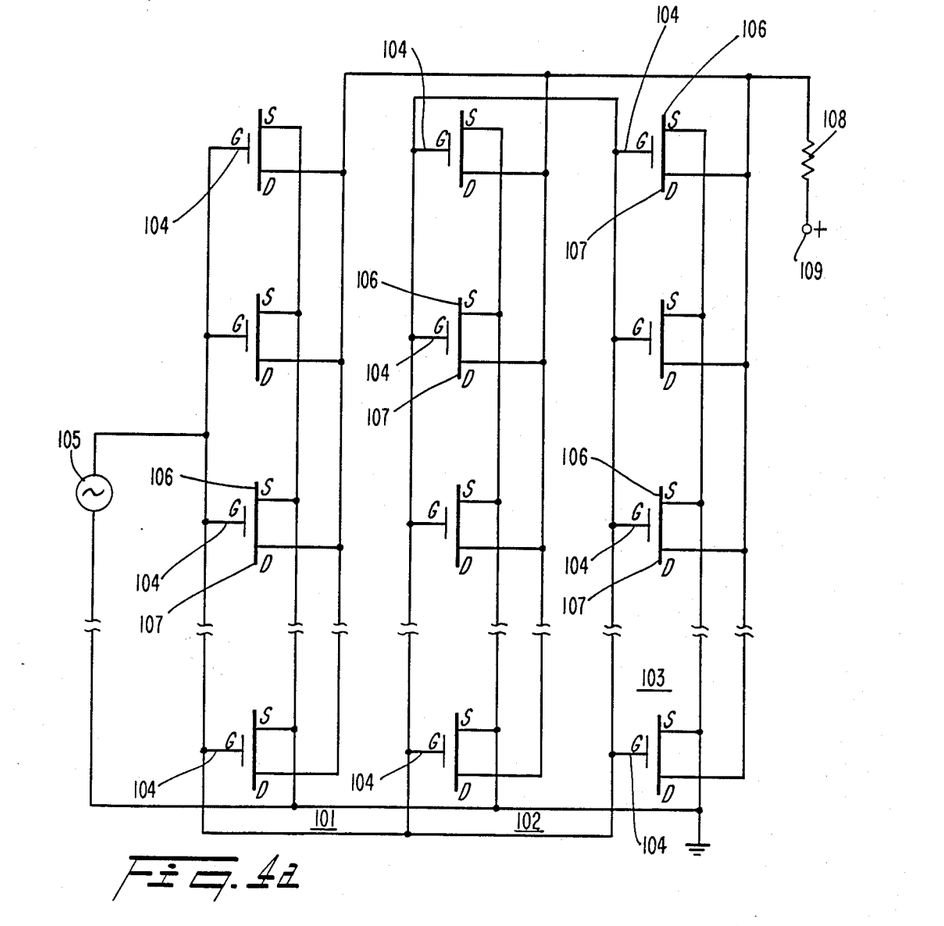
FIG. 4a is a circuit diagram of the device of FIG. 4.

FIG. 4a, a circuit diagram of the structure illustrated in FIG. 4, includes three parallel banks 101, 102 and 103 of a like number (18 in the illustrated embodiment) of parallel microwave FETs, respectively representing the devices on composite units 61, 62 and 63. Each of banks 101, 102 and 103 includes multiple, parallel gate electrodes 104 responsive to microwave source 105, multiple grounded source electrodes 106 and multiple drain electrodes 107 connected in parallel to microwave load 108, in turn connected to a positive D.C. power supply terminal 109.

Figure 7:
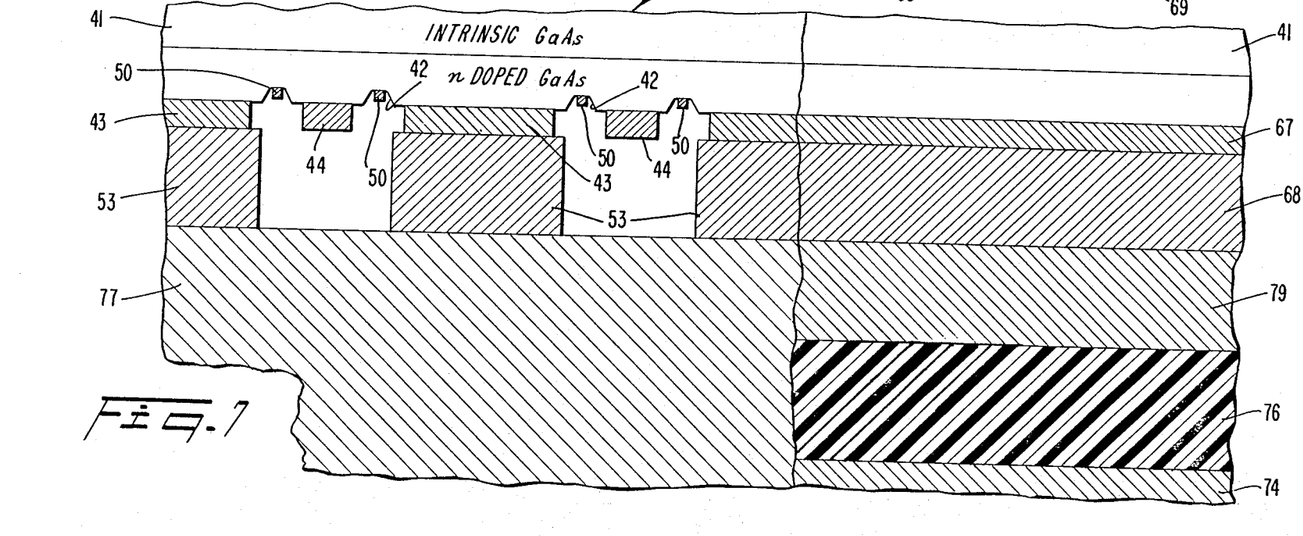
FIG. 7 is a side view taken through the lines 7—7 in each of FIGS. 4 and 6.

The gate and drain electrodes in each of units 61–63 respectively include elongated strips 65 and 66 on opposite sides of a pellet forming the composite, 18 channel unit. As illustrated in FIGS. 4 and 7, the drain includes an elongated tab 67 that extends from strip 66 that is connected to the interdigitated fingers. Tab 67 carries a single elongated, highly conductive, chemically inert drain post 68, while elongated, highly conductive, chemically inert gate post 69 is carried by strip 65. Source posts extend from the source fingers in each of units 61-63 in the same manner described in connection with FIG. 3. Gate and drain strips 65 and 66 have lengths of 650 micrometers and 600 micrometers, respectively.

Figure 5:
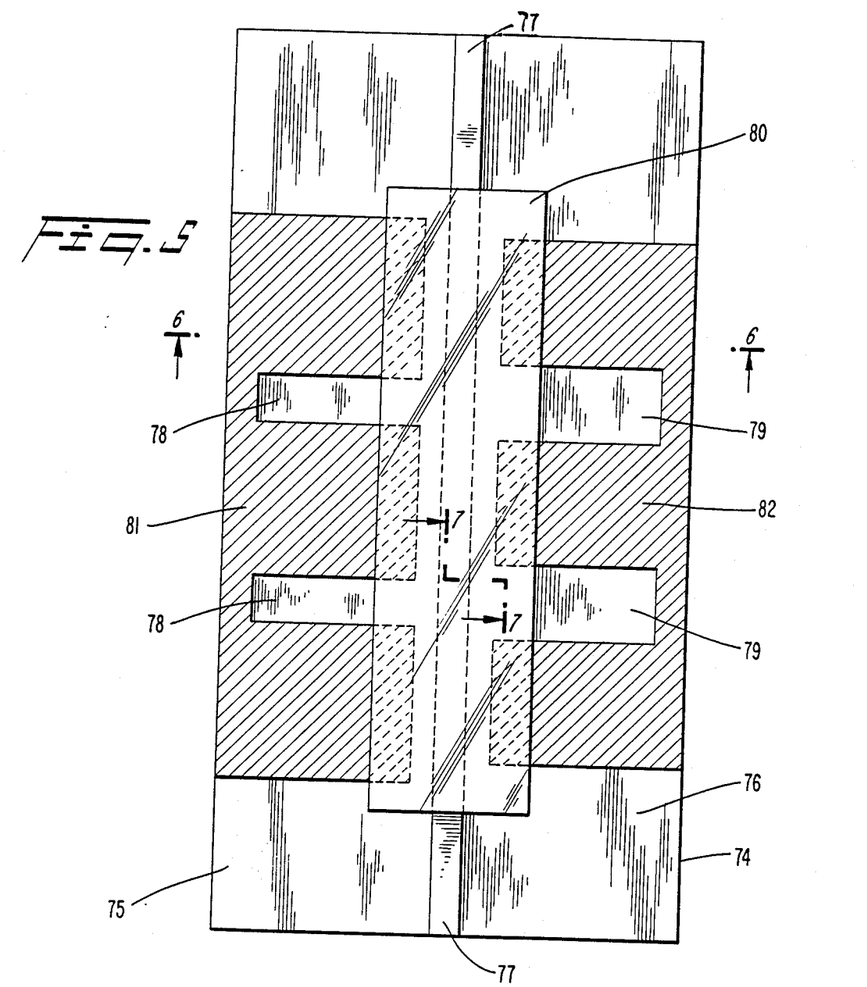
FIG. 5 is a top view of a flip-chip carrier for the GaAs FET illustrated in FIG. 4.
Figure 6:
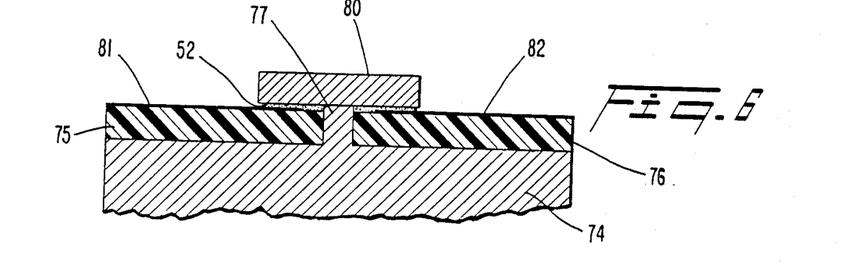
FIG. 6 is a sectional view taken through the lines 6—6, FIG. 5.

The co-planar gate, source and drain electrodes of cells 61-63 are plated on a common GaAs pellet 80 (FIGS. 5, 6 and 7)that extends from edge 71 of unit 61 to edge 72 of unit 63, across the interdigitated source and drain fingers of units 61-63. As illustrated in FIGS. 5, 6 and 7,pellet 80 is mounted in a flip-chip configuration, whereby the pellet face remote from the source, drain and gate electrodes is remote from metallic, preferably copper, substrate 74. Plated onto the upper face of substrate 74 are spaced dielectric films 75 and 76, between which extends upwardly extending island 77 of copper substrate 74. The upper edge of island 77 is gold plated (not shown) and bonded to source posts 53, in turn coated on fingers 43. FIG. 7 also clearly shows the positioning of gate 50 between source and drain fingers 43 and 44.

Dielectric strip 75 carries metallic pattern 81 with un-metalized areas 78. The metallic pattern 81 is designed as a distributed microwave circuit or transmission line to further match the impedance of the FET chip to the microwave source and the load impedance of 50 ohms. The microwave signal to be amplified is applied to pattern 81. Coated on dielectric layer 76 is metalization pattern 82 leaving an un-metlized area 79. Pattern 82 supplies the amplified signal to a load. The gate posts 69 and the drain posts 68 (FIG. 4) are connected to metal patterns 81 and 82, respectively, by a proper scheme such as a thermal compression bond. The longitudinal axes of the patterns 81 and 82 are aligned and spaced one third from the edges of the gallium arsenide pellet on which the electrodes illustrated in FIG. 4 are mounted. Tabs within pattern 81 have a width enabling each of them to be bridged to and be connected to post 69 of an adjacent pair of cells 61 and 62 or of post 69 of cells 62 and 63. Similarly, tabs 82 have a width enabling them to be bridged to and connected to post 68 of a pair of adjacent cells 61 and 62 or of post 68 of a pair of adjacent cells 62 and 63. Thereby, an ohmic connection is established for the microwave source connected to pattern 81 and to gate strip 65 of units 61-63 by way of gate post 69 of the three units, and ohmic connections are established between drain pads 66 of units 61-63 to the load connected to pattern 82 by way of drain post 68 of the three units.

The three cell pellet illustrated in FIG. 4 and mounted on substrate 74 has a length of approximately 2.54 millimeters and a width of 0.6 millimeters. Each of units 61-63 is dimensioned so that at 16 GHz, there is a distance of approximately 40 degrees between the gate post and the active region, and a distance of approximately 50 degrees between the interdigitated fingers and drain post 68. The flip-chip configuration of FIGS. 5 and 6 enables units 61-63 to be connected in parallel with the microwave source and the load. Because individual cells 61-63 are impedance matched before being combined in a three cell pellet, the impedance of the 3.5 watt GaAs FET device remains reasonably high and can be matched to 50 ohm sources and loads without excessive loss.

While there have been described and illustrated several specific embodiments of the invention, it will be clear that variations in the details of the embodiment specifically illustrated and described may be made without departing from the true spirit and scope of the invention as defined in the appended claims.

I claim:

1. A microwave field effect transistor formed in a semiconductor chip comprising:
   active and inactive semiconductor regions,
   planar source, gate and drain electrodes an said chip with predetermined geometry and spacing therebetween, each having active and inactive segments respectively connected to said active and inactive regions,
   impedance matching means including said predetermined geometry and spacing of said inactive segments of at least one of the electrodes for establishing predetermined parasitic shunt capacitances and series inductances to provide substantial impedance matching on said chip to a signal source and/or a load driving and driven by said transistor, respectively.

2. The microwave field effect transistor of claim 1 wherein said impedance matching means includes a conductive pad as a portion of the inactive segment of the gate electrode, said pad being spaced from the active segment of the gate electrode.

3. The microwave field effect transistor of claim 1 wherein said impedance matching means includes a conductive pad as a portion of the inactive segment of either the source or drain electrode, said pad being spaced from said active segments of the source and drain electrodes.

4. The microwave field effect transistor of claim 1 wherein said impedance matching means includes the active segment of the gate electrode, a portion of the active segment being long and narrow with respect to the inactive segment of the gate electrode.

5. The microwave field effect transistor of claim 1 wherein said inactive semiconductor regions are comprised of intrinsic GaAs.

6. The microwave field effect transistor of claim 1 wherein said transistor is rigidly connectable, in a flip-chip configuration, to a dielectric pellet with a metallic electrode pattern thereof, said pellet and electrode pattern forming a transmission line for providing further impedance matching to a signal source and a load for said transistor.

7. The microwave field effect transistor of claim 11 wherein said transistor is comprised of a plurality of field effect transistor cells.

8. The microwave field effect transistor of claim 7 wherein said source, gate and drain electrodes are each comprised of a series of interdigitated fingers connected to said cells.

9. The microwave field effect transistor of claim 8 wherein at least one of said source, gate and drain electrodes includes at least one conductive pad, said at least one pad being less in number than the interdigitated fingers of said electrode.

10. The microwave field effect transistor of claim 1 wherein said impedance matching means provides an impedance with an order of magnitude of 20 ohms.

11. The microwave field effect transistor of claim 1 wherein said inactive segments of said electrodes are less than a wavelength of the frequency of a signal source to which the transistor is connectable.

* * * * *